United States Patent [19]

Devitt et al.

[11] 4,248,258
[45] Feb. 3, 1981

[54] FLAT ROOF AUXILIARY DRAIN SYSTEM

[76] Inventors: Gerald J. Devitt, 131 Pond St.; Richard A. Ritter, 9 Green Meadow Dr., both of Billerica, Mass. 01821

[21] Appl. No.: 47,360

[22] Filed: Jun. 11, 1979

[51] Int. Cl.³ ............................................. F04F 10/00
[52] U.S. Cl. .................................. 137/124; 137/132; 137/147; 137/357; 417/411
[58] Field of Search ............... 137/124, 132, 147, 357; 417/411

[56] References Cited

U.S. PATENT DOCUMENTS

Re. 28,491  7/1975  Kundert ................................ 137/142
3,757,812  9/1973  Duncan ................................. 137/142

*Primary Examiner*—Gerald A. Michalsky
*Attorney, Agent, or Firm*—Prutzman, Kalb, Chilton & Alix

[57] ABSTRACT

A flat roof solar powered auxiliary drain system having master and satellite modules with respective drain lines and electric pumps for charging the drain lines for syphoning standing water from a flat roof, the master module having a battery and a solar cell for charging the battery for supplying power for operating the electric pumps and a control circuit for selectively energizing the electric pumps for removing standing water.

9 Claims, 3 Drawing Figures

FLAT ROOF AUXILIARY DRAIN SYSTEM

BRIEF SUMMARY OF THE INVENTION

The present invention relates to a new and improved flat roof auxiliary drain system for draining standing water from a flat roof and the like and which is designed to supplement an existing drain system and help prevent undue accumulation of standing water and potential resultant structural damage.

It is a primary aim of the present invention to provide a new and improved auxiliary drain system for flat roofs and the like which provides for the automatic removal of standing water from the roof. In accordance with the present invention the auxiliary drain system is installed to drain water from the low points of the flat roof and thereby minimize the accumulation of standing water on the roof.

It is another aim of the present invention to provide a new and improved flat roof auxiliary drain system which is completely automatic, which does not require electrical connection to the electrical circuit of the building on which it is installed, and which can be located and relocated on a flat roof as desired and as conditions dictate.

It is a further aim of the present invention to provide a new and improved flat roof auxiliary drain system which is battery powered, which is completely automatic and which employs a photovoltaic solar cell for battery recharging.

It is another aim of the present invention to provide a new and improved flat roof auxiliary drain system which provides reliable operation over a long service free life, which may be installed for continuous use on an indefinite basis and which is automatically disabled to protect the system against damage during freezing conditions.

Other objects will be in part obvious and in part pointed out more in detail hereinafter.

A better understanding of the invention will be obtained from the following detailed description and the accompanying drawings of an illustrative application of the invention.

DESCRIPTION OF THE PREFERRED EMBODIMENTS

Figure 1:
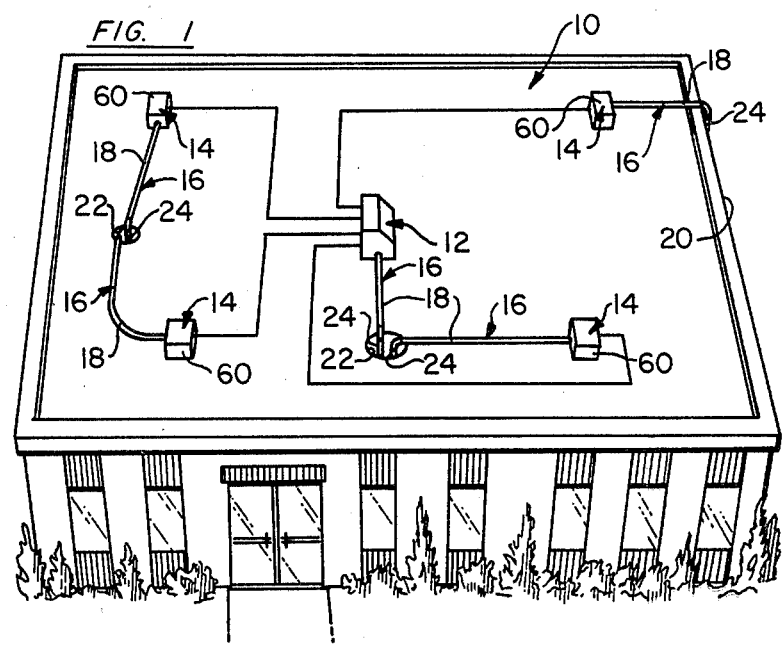
FIG. 1 is a perspective view, partly broken away, of a flat roof installation of an auxiliary drain system incorporating an embodiment of the present invention.

Referring now to the drawings in detail wherein like numerals represent like parts throughout the several figures, a flat roof drain system 10 incorporating an embodiment of the present invention is shown comprising a master drain module 12 and four separate satellite or slave drain modules 14 connected for being controlled by the master module 12 as hereinafter described. Each master and satellite module 12, 14 has a separate drain line 16 for draining standing water from the part of the roof where the module is installed and for that purpose the modules 12, 14 are placed at the low points on the roof, and preferably with the master module at the low point on the roof where the deepest standing water could occur.

Each module drain line 16 comprises a suitable roof hose section 18 of plastic tube having the necessary length for conducting water to the edge 20 of the roof or to a drain conduit 22 in the roof and a syphoning hose section 24 of plastic tube connected to the roof hose section by a 90° elbow and having a sufficient length to provide a minimum 30 inch syphoning head for syphoning water through the drain line 16 from the respective drain module 12, 14.

Figure 2:
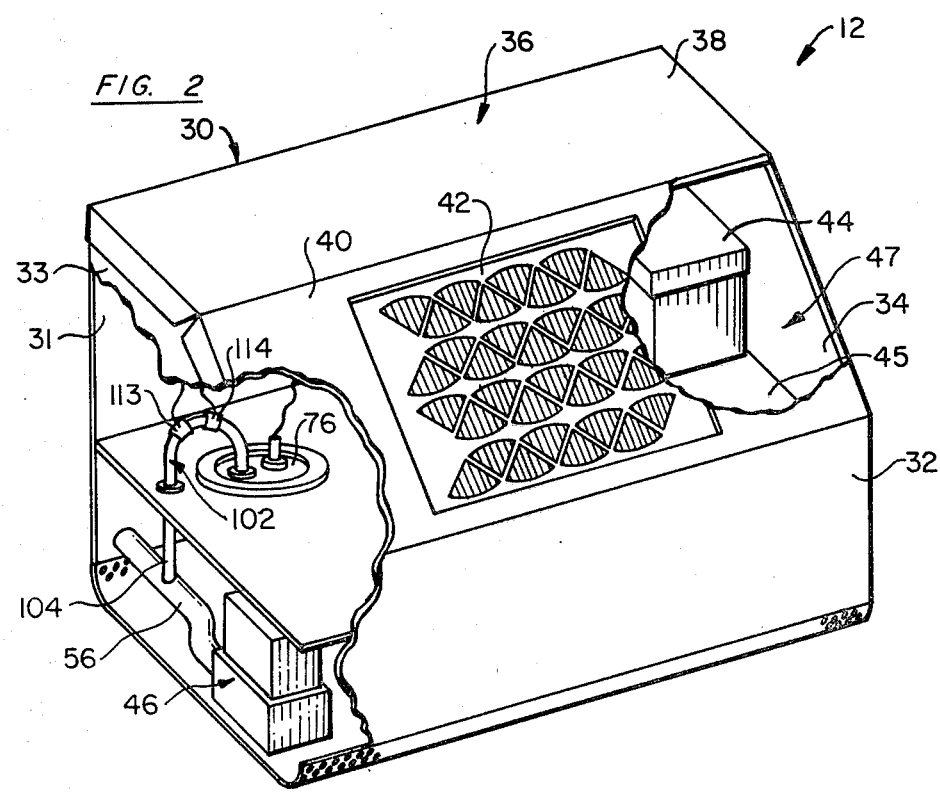
FIG. 2 is a perspective view, partly broken away and partly in section of a master drain module of the auxiliary drain system.
Figure 3:
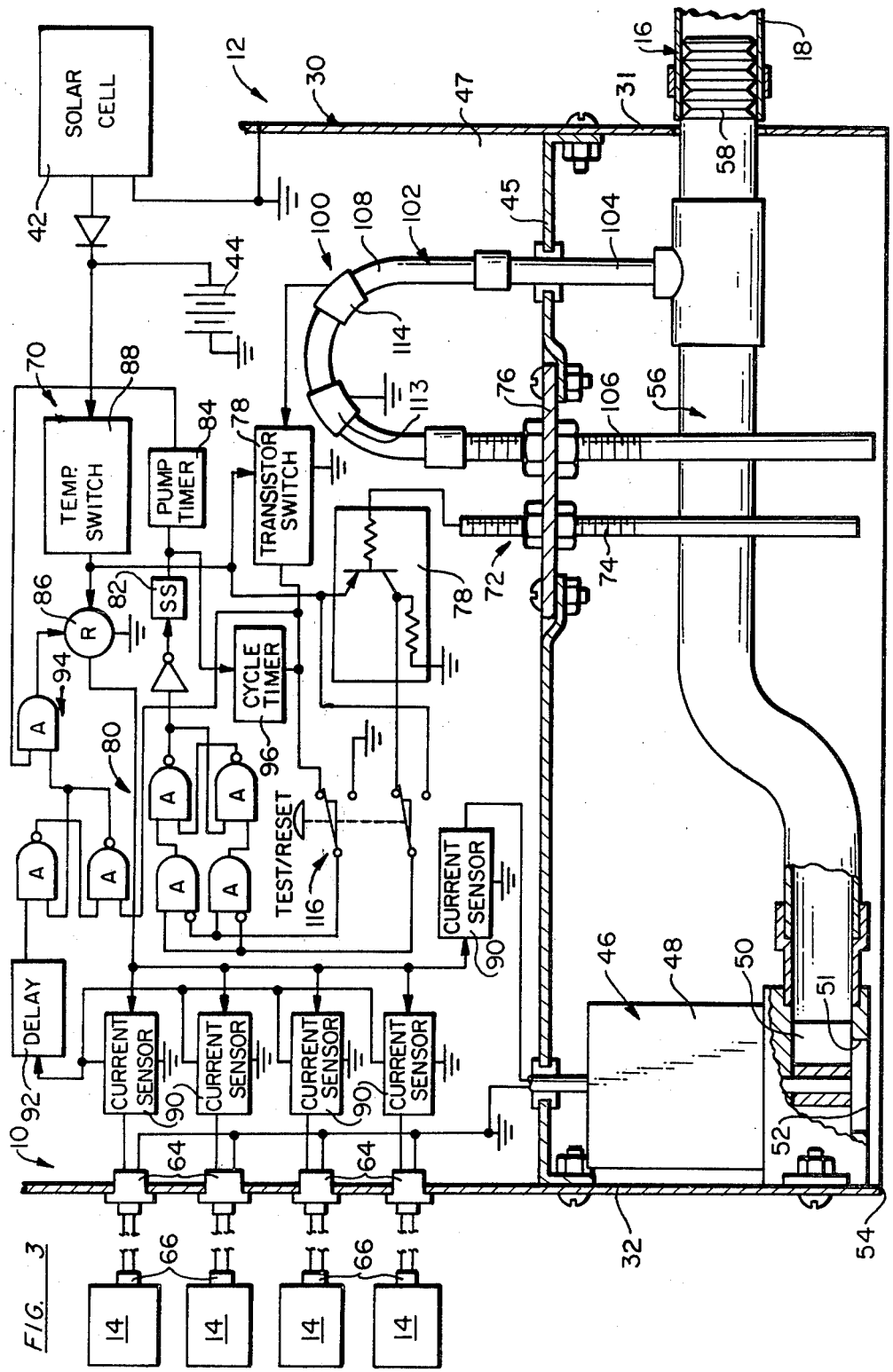
FIG. 3 is a partly schematic, partly elevation section view, partly broken away and partly in section, of the auxiliary drain system.

Referring to FIGS. 2 and 3, the master drain module 12 comprises a rigid box-like housing 30 of non-corrosive sheet metal such as aluminum and having flat parallel front and rear walls 31, 32 and flat parallel truncated sidewalls 33, 34. A cover or lid 36 of the housing 30 has a flat horizontal portion 38 and a flat inclined portion 40 with a rectangular opening for receiving a suitable photovoltaic solar cell or collector 42. The solar cell 42 may be of conventional design and is mounted on the inside of the inclined cover portion 40 and suitably calked around its perimeter to prevent the entrance of water through the cover 36. The solar collector 42 for example is made of selenium, provides a 12 volt output and is connected for charging a suitable 12 volt battery 44 mounted on a raised deck or shelf 45 within an upper water-tight chamber 47 of the master module housing 30.

The inclination of the solar collector 42 and therefore also the inclined cover portion 40 is established to provide optimum average collector effectiveness and therefore at an angle approximately equal to the latitude of the installation. For example, the inclination is established at 45° for installations between 40° and 50° latitude. Also, the master module 12 is installed so that its inclined solar collector 42 faces approximately due south.

A suitable electric non-positive displacement pump 46 having a 12 volt electric drive motor 48 is mounted on a sidewall 33 of the housing 30 below the housing support deck 46. The electric pump 46 shown has a vertical axis with a lower pump impeller 50 having an axial inlet conduit 51 with an inlet opening 52 at the lower end of the pump housing. The pump 46 is mounted on the housing sidewall 33 with the pump inlet opening 51 preferably approximately 3/16th inch above the lower edge 54 of the housing, which in the housing shown in FIG. 3 provides a planar support base for supporting the solar module on the flat roof. Accordingly, the pump 46 is mounted with its inlet opening 52 approximately 3/16th inch above the surface of the roof. One or more of the walls 31-34 of the housing have screens or apertures along their lower edge, or the housing has a perforated bottom as shown in FIG. 2 to provide for conducting any standing water on the flat roof to the pump inlet opening.

A plastic outlet or discharge conduit 56 is connected to the pump outlet for conducting water from the pump and through the rear wall 31 of the housing. The discharge conduit 56 has an outer end with an adapter 58 external of the housing for receiving the drain hose 18.

Each satellite drain module 14 comprises a simple box-like housing 60 with an electric pump 46 which may be identical to the pump of the master module 12. Also, each satellite module pump 46 is mounted within its housing 60 in the manner of the master module pump and with its lower inlet opening approximately 3/16th inch or less above the lower edge or support base of the satellite module housing. Further, each satellite module housing 60 has a screen or series of apertures along one or more of its side walls for conducting any standing water to the inlet opening of the satellite pump.

The master module 12 has a bank of four electrical receptacles 64, and each satellite module 14 has a similar electrical receptacle 66 for connecting each satellite pump to the master module 12 with an electrical line of suitable length in accordance with the horizontal spacing of the satellite module 14 from the master module 12 and whereby each satellite pump is connected to be energized by a pump control system 70 of the master module as hereinafter described.

In the drain system of the present invention, the electric pumps of the master and satellite modules 12, 14 are energized temporarily to charge the respective drain lines sufficiently to thereafter permit the drain lines to syphon away any remaining standing water on the roof. For that reason, the diameter of the pump discharge conduits and drain hoses are made sufficiently small (e.g. $\frac{3}{4}$th inch I.D.) to ensure that the drain lines can be fully charged by the pumps in a relatively short interval and the pumps are energized sufficiently long (e.g. to charge 100 feet of $\frac{3}{4}$th inch I.D. plastic tubing) for subsequent effective syphoning action.

Referring to FIG. 3 the pump control system 70 is provided in the master module 12 for automatically energizing and deenergizing the electric pump 46 of the master module 12 and also simultaneously energize and deenergize the electric pumps of the satellite modules 14. A level control sensor 72 having a depending brass sensor rod or probe 74 mounted on a plastic insulated section 76 of the housing deck 45 is provided for sensing when the standing water reaches a predetermined level at the sensor probe 74. For that purpose, the probe 74 is mounted on the support deck section 76 to be axially adjusted to establish the height of the lower end of the sensor probe 74 above the surface of the roof. The sensor probe 74 is adjusted so that its lower end is higher than the pump inlet opening 52 and for example so that it is about $\frac{3}{8}$th inch above the roof surface. The roof is grounded through the metal housing and when the standing water is sufficiently deep to contact the sensor probe 74, a signal generated by a transistor switch circuit 78 is transmitted via a logic interlock or control circuit 80 to a suitable single shot 82. The output signal of the singleshot 82 is employed to energize a pump motor timer 84 and thereby simultaneously energize a relay 86 for energizing the electric pumps 46 of the master and satellite modules 12, 14. The pump timer 84 times out after for example 1½ minutes to deenergize the pump relay 86 and thereby deenergize the electric pumps 46. As previously indicated, the short interval of pump operation is established to adequately charge the pump drain lines 16 for subsequent syphoning action.

A suitable temperature sensitive switch 88 is provided as a protective device in the main electrical line from the battery 44 to prevent pump energization when a pump 46 or drain line 16 is frozen or clogged with ice. The temperature switch 88 is set for example to inhibit pump operation when the temperature is below 0° Celsius. As an alternative or addition to the temperature switch 88, a suitable current sensor 90 is provided in the electrical line to each pump and the current sensors 90 are connected via a suitable delay circuit 92 and an interlock circuit 94 to automatically deenergize the pump relay 86 when an abnormally high pump current level continues for example for two seconds, indicating that the respective pump motor 46 has stalled due to ice blockage. The two second delay provided by the delay circuit 92 is employed to prevent relay deenergization due to normal startup current, and the interlock circuit 94 is connected for being reset by a drain cycle timer 96 to permit pump motor reenergization after each seven hour drain cycle hereinafter described.

The drain cycle timer 96 is provided for establishing a minimum cycle time interval between pump operating phases. The minimum cycle time interval is selected in accordance with the expected average rate and frequency of rainfall, the time interval for draining standing water from the average size flat roof pond and the energy available from the battery and solar cell for operating the pumps. Although the timer may be adjustable for establishing the minimum cycle time interval for each installation, it has been found that a minimum time of approximately seven hours provides optimum utilization of the battery and solar energy for removal of standing water from a typical flat roof. More particularly, it has been found it is generally unnecessary to energize the electric pumps 46 more than once each seven hour period, since where there is a steady continuing rain the syphoning phase of each drain cycle will provide for continually syphoning standing water from the roof at an acceptable rate which prevents significant increase in the standing water on the roof. Where there is a light rain, although the syphoning phase may end before the rain stops because the syphon is broken, any increase in the standing water which occurs after the syphon is broken will not normally present a problem. Also, splashing water or wind etc. will not cause the pumps to operate more than one each seven hour period.

An auxiliary syphon sensor system 100 shown in FIG. 3 may be used in place of or in addition to the drain cycle timer 96 for preventing reenergization of the electric pumps 46 before the prior drain cycle is completed. The auxiliary syphon sensor system 100 comprises an auxiliary syphon 102 with a vertical plastic tube 104 connected to the pump disharge conduit 56, a second vertically adjustable pickup tube 106 mounted on the plastic section 76 of the housing deck 45 and an intermediate ¼th inch I.D. flexible plastic sensor tube 108 connected between the two vertical tubes 104, 106. The sensor tube 108 is formed into an inverted U-shape and the free open end of the vertically adjustable pickup tube 106 is spaced a predetermined distance of for example ¼th inch above the surface of the roof (and therefore, slightly below the lower end of the sensor probe 74). At the beginning of each drain cycle (while the pump motors 48 are energized) standing water is syphoned from the free end of the auxiliary syphon 102 to fill the auxiliary syphon with water. During the subsequent syphon phase, water will continue to flow through the auxiliary syphon to the drain line 16. As the standing water is drained away, the surface of the standing water falls below the opening of the auxiliary syphon pickup tube 106 a short time after it falls below the lower end of the sensor probe 74. A flow sensor 100 employing a pair of electrodes 113, 114 on opposite sides of the apex of the inverted U-shaped sensor tube 108 are employed for sensing water flow within the tube. Accordingly, as long as the tube contains water between the two electrodes 112, 113, a signal is applied by a flow transistor switch 78 to the logic control or interlock circuit 80 to prevent reenergization of the electric pumps 46. As a result, the electric pumps 46 would not normally be reenergized until after the completion of the prior drain cycle. In addition, if the drain line 16 becomes frozen or clogged, water will also remain in the auxiliary syphon 102 to inhibit reenergization of the electric pumps 46.

A reset or test switch 116 is shown employed for resetting or testing the logic interlock circuit, for example for resetting the logic interlock circuit for a succeeding drain cycle or for testing that the circuit operates properly.

The switch button is preferably mounted for example on the side of the housing so it can be easily actuated to reset or test the circuit.

In summary, it can be seen that the flat roof drain system of the present invention can be easily installed on a flat roof without need for connection of the drain system to an electrical power source. Also the drain system provides for automatically monitoring the accumulation of standing water and for automatically draining the water from the roof without depleting the battery and which enables the solar cell to maintain the battery adequately charged. The flat roof drain system being totally self powered, needs no external power source and therefore saves the cost and complexity of connecting the auxiliary drain system to an external electrical source. The drain system provides flexibility in locating and relocating the master and satellite modules to provide optimum operation for each flat roof installation.

As will be apparent to persons skilled in the art, various modifications, adapations and variations of the foregoing specific disclosure can be made without departing from the teachings of the present invention.

I claim:

1. A flat roof solar powered auxiliary drain system for draining standing water from a generally flat roof, comprising a master module having a housing with a lower support base for supporting the master module on a generally flat roof, a battery power source mounted within the housing, a photovoltaic solar collector mounted on the housing and connected for charging the battery power source, a non-positive displacement electric pump mounted within the housing having a pump inlet conduit with an inlet opening adjacent to but above the support base of the housing and a pump outlet conduit adapted to be connected for syphoning water from the pump inlet opening and through the pump and pump inlet and outlet conduits, pump control means, including control circuit means, for selectively connecting the electric pump to the battery power source for automatically energizing the electric pump for a predetermined short time interval when the standing water reaches a predetermined level above the pump inlet opening and so that standing water can thereafter be syphoned through the pump and pump inlet and outlet conduits, at least one satellite module having a housing with a lower support base for supporting the satellite module on a flat roof spaced from the master module, a satellite electric pump mounted within the satellite module housing with an inlet conduit with an inlet opening adjacent to but above the support base of the satellite module housing and a pump outlet conduit adapted to be connected for syphoning water from the pump inlet opening and through the pump and pump inlet and outlet conduits, and a satellite electric line for each satellite module for connecting the electric pump of the satellite module to the master module, and wherein the control circuit means is operable for connecting each satellite electric line to the power source to energize the satellite pump in conjunction with the energization of the master module pump.

2. A flat roof auxiliary drain system for draining standing water from a generally flat roof, comprising a master module having a housing with a lower support base for supporting the master module on a generally flat roof, a power source, a water drain with a drain conduit for syphoning standing water from the roof, an electric pump mounted within the housing having an outlet conduit connected to the drain conduit for pumping standing water through the drain conduit to charge the drain conduit for syphoning standing water from the roof, pump control means, including control circuit means, for selectively connecting the electric pump to the power source for automatically energizing the electric pump for a short time interval for charging the drain conduit when the standing water reaches a predetermined level above the support base for syphoning standing water from the flat roof through the water drain, at least one satellite module having a housing with a lower support base for supporting the satellite module on a flat roof spaced from the master module, a satellite electric pump mounted within the satellite module housing with an inlet conduit with an inlet opening adjacent to but above the support base of the satellite module housing and a pump outlet conduit adapted to be connected for syphoning water from the pump inlet opening and through the pump and pump inlet and outlet conduits, and a satellite electric line for each satellite module for connecting the electric pump of the satellite module to the master module, and wherein the control circuit means is operable for connecting each satellite electric line to the power source to energize the satellite pump in conjunction with the energization of the master module pump.

3. A flat roof auxiliary drain system according to claim 1 or 2 wherein the control circuit means is operable for connecting each satellite electric line to the power source to energize each satellite pump simultaneously with the master module pump.

4. A flat roof solar powered auxiliary drain system for draining standing water from a generally flat roof, comprising a master module having a housing with a lower support base for supporting the master module on a generally flat roof, a battery power source mounted within the housing, a photovoltaic solar collector mounted on the housing and connected for charging the battery power source, a non-positive displacement electric pump mounted within the housing having a pump inlet conduit with an inlet opening adjacent to but above the support base of the housing and a pump outlet conduit adapted to be connected for syphoning water from the pump inlet opening and through the pump and pump inlet and outlet conduits, and pump control means, including control circuit means, for selectively connecting the electric pump to the battery power source for automatically energizing the electric pump for a predetermined short time interval when the standing water reaches a predetermined level above the pump inlet opening and so that standing water can thereafter be syphoned through the pump and pump inlet and outlet conduits, the control circuit means comprising drain cycle timing and interlock means for establishing a predetermined minimum cycle time interval between pump energization phases.

5. A flat roof auxiliary drain system for draining standing water from a generally flat roof, comprising a master module having a housing with a lower support base for supporting the master module on a generally flat roof, a power source, a water drain with a drain conduit for syphoning standing water from the roof, an electric pump mounted within the housing having an outlet conduit connected to the drain conduit for pumping standing water through the drain conduit to charge the drain conduit for syphoning standing water from the roof, and pump control means, including control circuit means, for selectively connecting the electric pump to the power source for automatically energizing the electric pump for a short time interval for charging the drain conduit when the standing water reaches a predetermined level above the support base for syphoning standing water from the flat roof through the water drain, the control circuit means comprising drain cycle timing and interlock means for establishing a predetermined minimum cycle time interval between pump energization phases.

6. A flat roof auxiliary drain system according to claim 4 or 5 wherein the drain cycle timing and interlock means establishes a minimum cycle time interval between pump energization phases of at least a plurality of hours.

7. A flat roof solar powered auxiliary drain system for draining standing water from a generally flat roof, comprising a master module having a housing with a lower support base for supporting the master module on a generally flat roof, a battery power source mounted within the housing, a photovoltaic solar collector mounted on the housing and connected for charging the battery power source, a non-positive displacement electric pump mounted within the housing having a pump inlet conduit with an inlet opening adjacent to but above the support base of the housing and a pump outlet conduit adapted to be connected for syphoning water from the pump inlet opening and through the pump and pump inlet and outlet conduits, and pump control means, including control circuit means, for selectively connecting the electric pump to the battery power source for automatically energizing the electric pump for a predetermined short time interval when the standing water reaches a predetermined level above the pump inlet opening and so that standing water can thereafter by syphoned through the pump and pump inlet and outlet conduits, the pump control means comprising an auxiliary syphon conduit having one free end with an inlet opening adjacent to but above the support base of the housing and its other end connected to the pump outlet conduit for syphoning water from the auxiliary syphon inlet opening to the pump outlet conduit, and the control circuit means comprising flow sensor means for sensing water in the auxiliary syphon conduit and operable for preventing reenergization of the electric pump when water is sensed therein.

8. A flat roof auxiliary drain system for draining standing water from a generally flat roof, comprising a master module having a housing with a lower support base for supporting the master module on a generally flat roof, a power source, a water drain with a drain conduit for syphoning standing water from the roof, an electric pump mounted within the housing having an outlet conduit connected to the drain conduit for pumping standing water through the drain conduit to charge the drain conduit for syphoning standing water from the roof, and pump control means, including control circuit means, for selectively connecting the electric pump to the power source for automatically energizing the electric pump for a short time interval for charging the drain conduit when the standing water reaches a predetermined level above the support base for syphoning standing water from the flat roof through the water drain, the pump control means comprising an auxiliary syphon conduit having one free end with an inlet opening adjacent to but above the support base of the housing and its other end connected to the pump outlet conduit for syphoning water from the auxiliary syphon inlet opening to the pump outlet conduit, and the control circuit means comprising flow sensor means for sensing water in the auxiliary syphon conduit and operable for preventing reenergization of the electric pump when water is sensed therein.

9. A flat roof auxiliary drain system according to claim 7 or 8 wherein the auxiliary syphon conduit comprises an inverted generally U-shaped section, and wherein the control circuit means comprises electrodes on opposite sides of the apex of the U-shaped section of the syphon conduit for sensing water in the conduit therebetween.

* * * * *